(12) United States Patent
Hayakawa et al.

(10) Patent No.: US 8,572,825 B2
(45) Date of Patent: Nov. 5, 2013

(54) METHOD FOR PRODUCING PIEZOELECTRIC COMPOSITE SUBSTRATE AND METHOD FOR PRODUCING PIEZOELECTRIC ELEMENT

(75) Inventors: Norihiro Hayakawa, Nagaokakyo (JP); Hajime Kando, Nagaokakyo (JP); Ippei Hatsuda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 212 days.

(21) Appl. No.: 13/111,040

(22) Filed: May 19, 2011

(65) Prior Publication Data

US 2011/0220275 A1     Sep. 15, 2011

Related U.S. Application Data

(63) Continuation of application No. PCT/JP2009/070536, filed on Dec. 8, 2009.

(30) Foreign Application Priority Data

Dec. 10, 2008   (JP) ................................ 2008-314093

(51) Int. Cl.
    *H04R 17/10*    (2006.01)
(52) U.S. Cl.
    USPC ......... 29/25.35; 29/594; 29/830; 205/192.18; 310/357; 156/247
(58) Field of Classification Search
    USPC ................ 29/25.35, 594, 830, 414, 418, 846; 205/192.18, 192.22; 156/247; 310/312, 310/348, 357
    See application file for complete search history.

(56) References Cited

U.S. PATENT DOCUMENTS 5,998,907 A      12/1999   Taguchi et al.
6,445,265 B1 *    9/2002   Wright .................... 29/25.35 X

FOREIGN PATENT DOCUMENTS

| JP | 55124316 A | * | 9/1980 | ................... 310/312 |
| JP | 11-055070 A | | 2/1999 | |
| JP | 2001-223556 A | | 8/2001 | |
| JP | 3264074 B2 | | 3/2002 | |
| JP | 2003-017967 A | | 1/2003 | |
| JP | 2004-513517 A | | 4/2004 | |

OTHER PUBLICATIONS

Machine Language Translation (English) of Japanese Patent Publication, JP 11-55070, Jul. 2013.*

(Continued)

*Primary Examiner* — A. Dexter Tugbang
(74) *Attorney, Agent, or Firm* — Keating & Bennett, LLP (57) ABSTRACT

A method for producing a piezoelectric composite substrate with satisfactory productivity controls the inclination of the crystal axis and the polar axis of a single-crystal thin film and prevents an adverse effect due to pyroelectricity in a production process. The method for producing a piezoelectric composite substrate provided with a plurality of piezoelectric materials includes an ion-implantation step, a bonding step, and a separation step. In the ion-implantation step, $H^+$ ions are implanted into a piezoelectric single crystal material. In the bonding step, the piezoelectric single crystal material is bonded to a piezoelectric single crystal material. At this time, the polarity of the polar surface of the piezoelectric single crystal material is opposite to the polarity of the polar surface of the piezoelectric single crystal material, the polar surfaces being bonded to each other. In the separation step, a separation layer of the piezoelectric single crystal material is divided by heating to separate a piezoelectric single-crystal thin film.

7 Claims, 4 Drawing Sheets

(56) References Cited

OTHER PUBLICATIONS

Machine Language Translation (English) of Japanese Patent Publication, JP 2003-17967, Jul. 2013.*
Official Communication issued in International Patent Application No. PCT/JP2009/070536, mailed on Jan. 19, 2010.
Osugi et al., "Single Crystal FBAR With LiNbO3 and LiTaO3 Piezoelectric Substance Layers", IEEE MTT-S International Microwave Symposium, 2007, pp. 873-876.
Bruel, "Silicon on Insulator Material Technology", Electronic Letters, Jul. 6, 1995, pp. 1201 & 1202, vol. 31, No. 14.

* cited by examiner

METHOD FOR PRODUCING PIEZOELECTRIC COMPOSITE SUBSTRATE AND METHOD FOR PRODUCING PIEZOELECTRIC ELEMENT

BACKGROUND OF THE INVENTION

1. Field of the Invention

The present invention relates to a method for producing a piezoelectric composite substrate including a plurality of piezoelectric single crystal materials and relates to a piezoelectric element including a driving electrode arranged on at least one piezoelectric single crystal material of the piezoelectric composite substrate.

2. Description of the Related Art

Piezoelectric vibrators and piezoelectric resonators each including a piezoelectric composite substrate with a single-crystal thin film made of a piezoelectric material have recently been developed. The single-crystal thin film made of a piezoelectric material has been produced by a production process including depositing a piezoelectric material, such as AlN or ZnO, using sputtering or CVD (for example, see Y. Osugi et al.; "Single Crystal FBAR with $LiNbO_3$ and $LiTaO_3$", 2007 IEEE MTT-S International Microwave Symposium, pp. 873-876). The single-crystal thin film formed by the production process has a c-axis orientation in which the orientation direction of the crystal axis is aligned vertically with respect to the substrate. Thus, the performance of a piezoelectric element cannot be adjusted by controlling the inclination of the crystal axis and the polar axis.

Furthermore, a conventional production process that can control the inclination of the crystal axis and the polar axis includes polishing a single-crystal material base made of a piezoelectric material (for example, see M. Bruel; "Silicon On Insulator Material Technology", Electronics Letters, vol. 31, Issue 14, Jul. 6, 1995, p. 1201). In this process, most of the piezoelectric material is discarded as shavings, which results in poor efficiency of utilization of the piezoelectric material. Moreover, it is difficult to provide a thin film having a uniform thickness, which causes poor productivity.

In addition, a plurality of piezoelectric materials can be thermally bonded to produce a piezoelectric element (for example, see Japanese Patent No. 3264074). In this case, after the piezoelectric materials are held and stacked, heating is performed. When the piezoelectric material is in the form of a thin film, the piezoelectric material is liable to be broken and difficult to handle, which also causes poor productivity.

When a piezoelectric composite substrate including a piezoelectric thin film bonded to another piezoelectric material is produced by a conventional production process, it is difficult to improve productivity while the crystal axis and the polar axis of a single-crystal thin film are controlled.

Furthermore, for a piezoelectric composite substrate in which a plurality of piezoelectric materials are bonded, the piezoelectric materials can be heated to locally develop pyroelectric charges on a bonding surface at the time of production, thereby damaging the bonding surface and reducing the piezoelectricity.

SUMMARY OF THE INVENTION

Preferred embodiments of the present invention provide a method for producing a piezoelectric composite substrate with satisfactory productivity, the method being capable of controlling the inclination of the crystal axis and the polar axis of a single-crystal thin film and circumventing an adverse effect due to pyroelectricity in a production process, and provide a method for producing a piezoelectric element.

According to a preferred embodiment of the present invention, a method for producing a piezoelectric composite substrate provided with a first piezoelectric single crystal material, in which a piezoelectric effect is used, and a second piezoelectric single crystal material bonded to the first piezoelectric single crystal material includes an ion-implantation step, a bonding step, and a separation step. In the ion-implantation step, ions are implanted into a first polar surface of the first piezoelectric single crystal material to form localized microcavities in a separation layer. The first polar surface has a substantially uniform polarity. The separation layer is located inside the first piezoelectric single crystal material and spaced apart from the first polar surface. In the bonding step, after the ion-implantation step, the first polar surface of the first piezoelectric single crystal material is bonded to a second polar surface of the second piezoelectric single crystal material. The second polar surface has a substantially uniform polarity opposite to that of the first polar surface. In the separation step, after the bonding step, the microcavities are subjected to thermal stress to divide the separation layer.

According to this production method, the positions of the first piezoelectric single crystal material and the second piezoelectric single crystal material can be controlled in the bonding step. Thus, the direction of the crystal axis can be desirably set. Furthermore, a thin film can be separated from the first piezoelectric single crystal material in the separation step. The first piezoelectric single crystal material can be reused. Thus, the crystal axis and the polar axis of a piezoelectric single-crystal thin film can be controlled, thereby improving productivity.

If the polar surfaces, having the same polarity, of the first and second piezoelectric single crystal materials are bonded to each other in the bonding step, the polarity on a bonding surface remains without being canceled. So, the bonding surface has pyroelectricity. Pyroelectric charges can be locally generated on the bonding surface by heating to cause the risk of damaging the bonding surface. In this production method, however, the polar surfaces, having opposite polarities, of the first and second piezoelectric single crystal materials are bonded to each other. So, the polarities are canceled on the bonding surface to substantially eliminate pyroelectricity. Thus, the bonding surface has satisfactory quality even if the microcavities are subjected to thermal stress in the separation step.

The method for producing a piezoelectric composite substrate according to a preferred embodiment of the present invention preferably includes a repolarizing step. The polarization of the surface of the piezoelectric single crystal material can be partially reversed by the effect of the ion implantation and thermal bonding. So, after the bonding step, the application of an electric field in the repolarizing step recovers the reversed polarization.

The application of the electric field in the repolarizing step causes the deformation of the piezoelectric materials. If the polar surfaces, having the same polarity, of the first and second piezoelectric single crystal materials are bonded to each other in the bonding step, i.e., if the first and second piezoelectric single crystal materials have opposite polarization directions in the direction perpendicular to the bonding surface, the strains of the piezoelectric single crystal materials in the direction perpendicular to the bonding surface are caused in opposite directions by the application of the electric field in the repolarizing step. This can damage the bonding surface to cause wafer breakage or the like. In this production method, however, the polar surfaces, having opposite polarities, of the first and second piezoelectric single crystal materials are bonded to each other. The first and second piezoelectric single crystal materials have the same polarization direction in the direction perpendicular to the bonding surface. So, the strains of the piezoelectric single crystal materials in the direction perpendicular to the bonding surface are caused in the same direction by the application of the electric field in the repolarizing step. Thus, damage to the bonding surface is reduced.

Furthermore, according to the production method, the detection of an inversion current generated when the reversed polarization is recovered is facilitated. If the polar surfaces, having the same polarity, of the first and second piezoelectric single crystal materials are bonded to each other in the bonding step, unreversed polarization in the second piezoelectric single crystal material can also be recovered (reversed) by the application of the electric field. In this case, the inversion current in the second piezoelectric single crystal material causes difficulty in detecting the inversion current from the first piezoelectric single crystal material. Meanwhile, according to the production method, the polar surfaces, having opposite polarities, of the first and second piezoelectric single crystal materials are bonded to each other. Thus, substantially no polarization reversal in the second piezoelectric single crystal material occurs, thereby facilitating the detection of the inversion current from the first piezoelectric single crystal material. The detection of the inversion current from the first piezoelectric single crystal material facilitates the control of the repolarizing step and the determination of the completion of the repolarizing step.

The repolarizing step of various preferred embodiments of the present invention is preferably performed after the separation step. In this case, polarization reversal due to heating or the like in the separation step can be recovered in the repolarizing step while damage due to strain is prevented.

In the bonding step of a preferred embodiment of the present invention, preferably, the second piezoelectric single crystal material is bonded to the first piezoelectric single crystal material in such a manner that the direction of the polar axis of the second piezoelectric single crystal material is the same as that of the first piezoelectric single crystal material. In this case, the same strain direction is obtained in the direction parallel to the bonding surface at the time of the application of an electric field to the piezoelectric single crystal materials. This further reduces the risk of wafer breakage and so forth.

In the ion-implantation step of a preferred embodiment of the present invention, preferably, ions having a polarity opposite to that of the first polar surface are implanted into the first polar surface. In general, the energy required for the displacement of a constituent element of an electric dipole in the piezoelectric single crystal material is significantly lower than the energy required for the removal of the constituent element from a unit cell. In the case where the oppositely charged ions are implanted from the first polar surface, the ions are implanted from the same direction as the direction in which spontaneously polarized ions are displaced in the piezoelectric single crystal material. This suppresses the polarity reversal of spontaneous polarization. For example, in the case of the piezoelectric single crystal material made of $LiTaO_3$ or $LiNbO_3$, Li ions, Ta ions, and Nb ions are displaced toward the positive direction of the c-axis. Thus, cations are preferably implanted from the negative direction of the c-axis to the positive direction of the c-axis.

An electrode pattern may be arranged on the first polar surface or the second polar surface of a preferred embodiment of the present invention in such a manner that the first polar surface or the second polar surface is partially exposed. Even if the electrode pattern is arranged on the bonding surface, pyroelectricity is preferably prevented by the present invention as long as a portion of the first piezoelectric single crystal material is directly bonded to the second piezoelectric single crystal material at the bonding surface.

A method for producing a piezoelectric element according to a preferred embodiment of the present invention may include a step of forming a driving electrode on the first piezoelectric single crystal material of the piezoelectric composite substrate produced by a method described in more detail below.

According to a preferred embodiment of the present invention, the directions of the crystal axes of the first piezoelectric single crystal material and the second piezoelectric single crystal material can be desirably set in the bonding step. Furthermore, the first piezoelectric single crystal material from which the thin film has been separated in the separation step can be reused. Thus, the inclination of the crystal axis and the polar axis of the single-crystal thin film can be controlled, thereby improving the productivity.

Furthermore, the oppositely polarized surfaces of the first piezoelectric single crystal material and the second piezoelectric single crystal material are bonded in the bonding step, so that the bonding surface has little pyroelectricity. Even if the microcavities are subjected to thermal stress in the separation step after the bonding step, few pyroelectric charges are generated, thus preventing damage to the bonding surface to provide satisfactory piezoelectricity.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

A method for producing a piezoelectric composite substrate according to a first preferred embodiment of the present invention will be described below with reference to a method for producing a surface acoustic wave resonator as an example.

Figure 1:
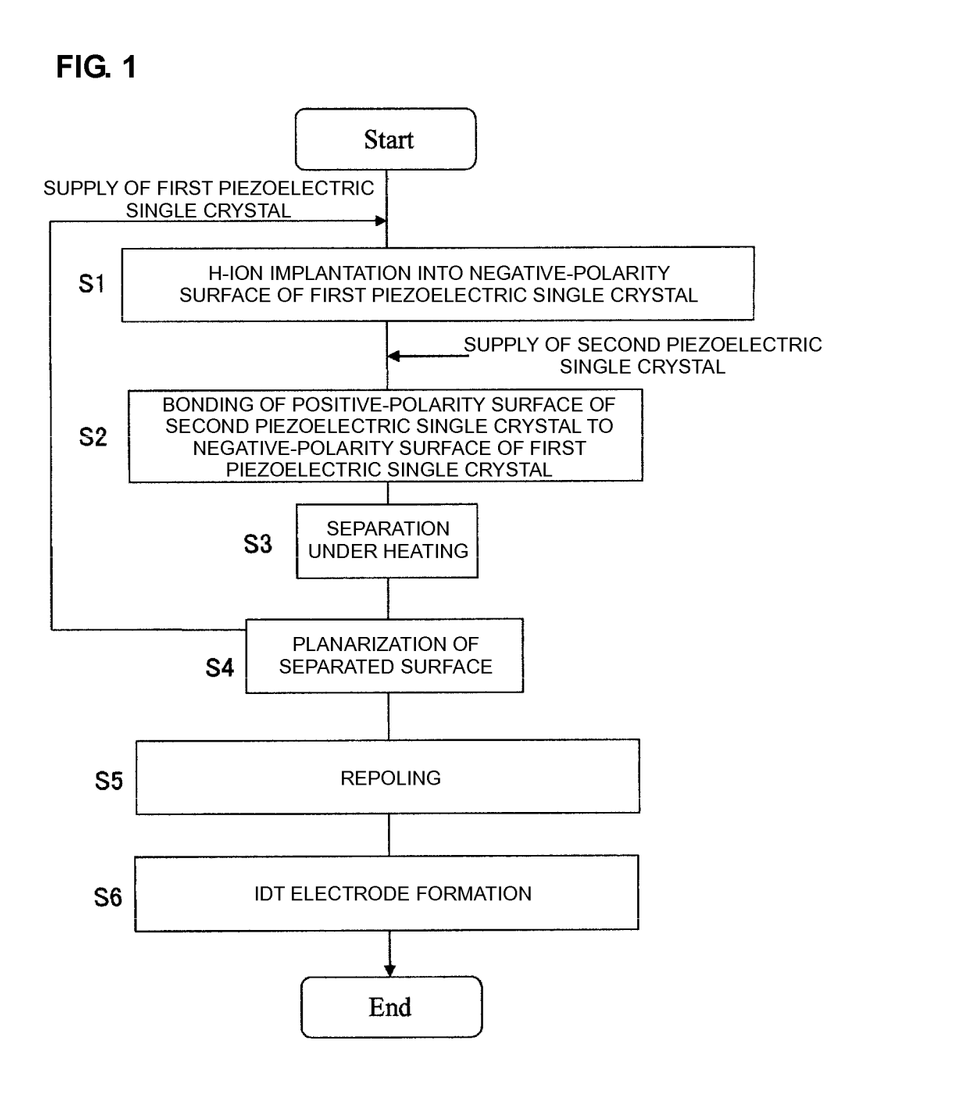
FIG. 1 illustrates a flow chart of a method for producing a surface acoustic wave resonator according to a first preferred embodiment of the present invention.
Figure 2:
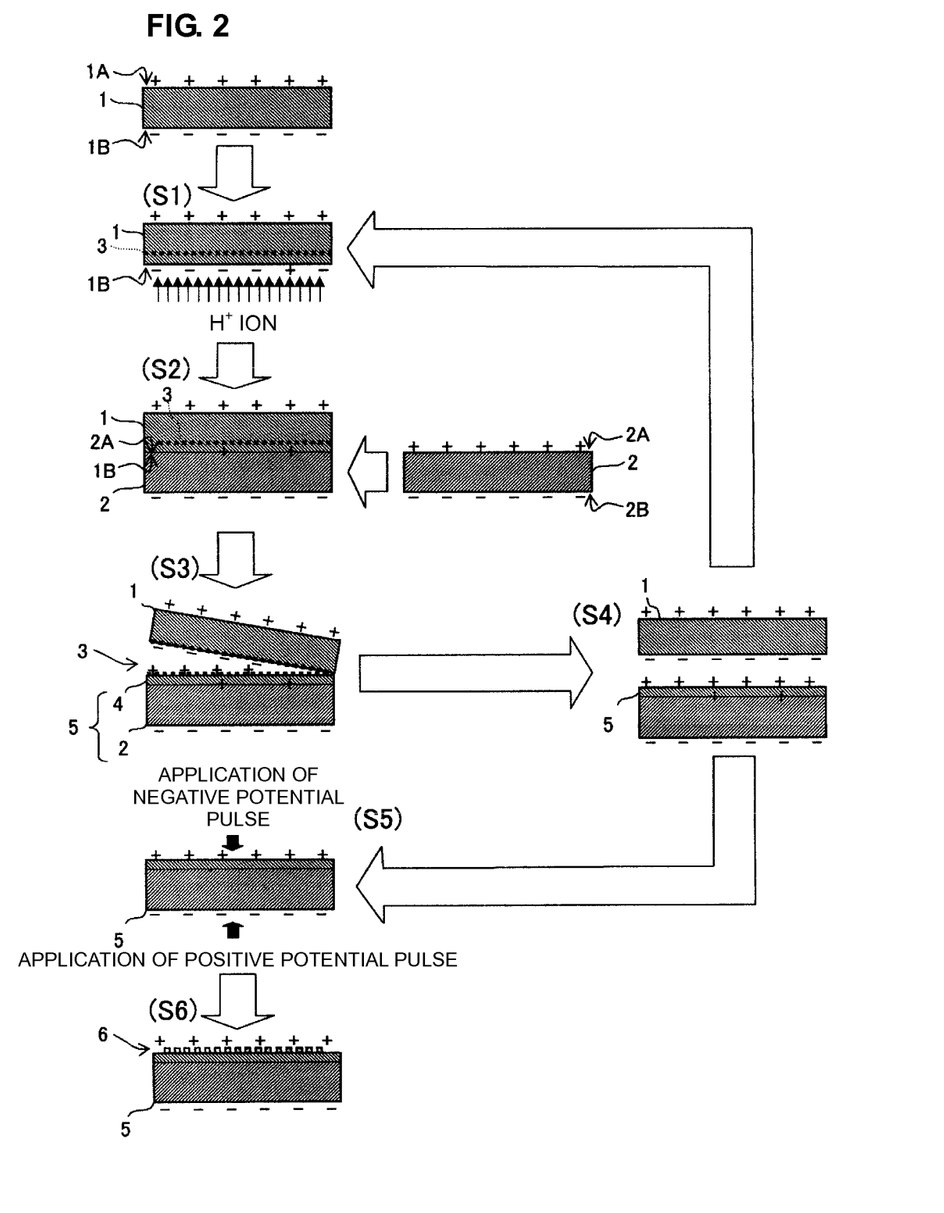
FIG. 2 is a schematic view illustrating a piezoelectric composite substrate, a piezoelectric single crystal material, and a support substrate in steps in the flow chart according to the first preferred embodiment of the present invention.

FIG. 1 illustrates a flow chart of a method for producing a surface acoustic wave resonator according to this preferred embodiment of the present invention. FIG. 2 is a schematic view illustrating a piezoelectric composite substrate, a piezoelectric single crystal material, and a support substrate in steps in the flow chart according to this preferred embodiment of the present invention.

In this preferred embodiment, a 42° Y cut LiTaO$_3$ substrate is preferably used as a first piezoelectric single crystal material 1, for example. Thus, the crystal axis of the first piezoelectric single crystal material 1 is inclined at 42° to the direction normal to a main surface, and the polar axis is inclined at 48° to the direction normal to the main surface. The crystal axis affects the electromechanical coupling coefficient, frequency-temperature characteristics, and sound velocity, and thus, has an important effect on, for example, the frequency, bandwidth, and insertion loss of the surface acoustic wave resonator. The foregoing inclination of the crystal axis of the first piezoelectric single crystal material 1 used in this preferred embodiment results in a surface acoustic wave resonator having excellent characteristics. In this preferred embodiment, the crystal axis of the first piezoelectric single crystal material 1 can be controlled, which results in a high degree of design flexibility, e.g., the frequency, bandwidth, insertion loss, electromechanical coupling coefficient, frequency-temperature characteristics, and sound velocity of a surface acoustic wave resonator to be produced.

The first piezoelectric single crystal material 1 has been subjected to polarizing. The polarizing results in the arrangement of a plurality of electric dipoles spontaneously polarized along a polar axis in the piezoelectric single crystal material and the uniform orientation of the polarization of the electric dipoles. In this state, the polarities of adjacent electric dipoles are canceled. Each of the main surfaces, on which adjacent electric dipoles are not present, of the first piezoelectric single crystal material 1 is positively or negatively polarized and has a substantially uniform polarity over the entire surface.

In this preferred embodiment, a second piezoelectric single crystal material 2 that has been subjected to polarizing is used as a support substrate of the first piezoelectric single crystal material 1. The use of, for example, a Z cut wafer, in which many Z cut wafers are available on the market, as the second piezoelectric single crystal material 2 reduces the production cost, which is preferred.

In this production process, an ion-implantation step (S1) of implanting H$^+$ ions into a main surface 1B of the first piezoelectric single crystal material 1 is performed. The main surface 1B has been mirror-polished. Here, the main surface 1B is a first polar surface having a substantially uniform, negative polarity. A main surface 1A opposite the main surface 1B is a polar surface having a substantially uniform, positive polarity.

The implantation energy of H$^+$ ions is preferably set to about 150 KeV, for example. The dose level (density of implanted ions) is preferably set to about $9\times10^{16}$ atom/cm$^2$, for example. In this case, H$^+$ ions are accumulated at a depth of about 1 µm below the main surface 1B of the first piezoelectric single crystal material 1 to form microcavities, which is defined as a separation layer 3. Here, the polarization of the main surface 1B can be partially reversed by the energy of ions implanted, so that the main surface 1B can partially have a positive polarity.

A bonding step (S2) of directly bonding the main surface 1B of the first piezoelectric single crystal material 1 to a main surface 2A of the second piezoelectric single crystal material 2 is performed. The main surface 2A has been mirror-polished. Here, the main surface 2A is a second polar surface having a substantially uniform, positive polarity. A main surface 2B opposite the main surface 2A is a polar surface having a substantially uniform, negative polarity. Here, in the case of performing the bonding step (S2) by, for example, thermal bonding, the polarization of the main surface 1B can be partially reversed by the energy of ions implanted, so that the main surface 1B can partially have a positive polarity. Furthermore, the polarization of the main surface 2A can be partially reversed, so that the main surface 2A can partially have a negative polarity.

In this way, because the negatively polarized surface of the first piezoelectric single crystal material 1 is bonded to the positively polarized surface of the second piezoelectric single crystal material 2, the polarities of the polarized surfaces are basically canceled. However, the polarities given by partial polarization reversal due to ion implantation and thermal bonding remain without being canceled. So, the bonding surface has weak pyroelectricity.

A separation step (S3) is performed which includes disposing the first piezoelectric single crystal material 1 and the second piezoelectric single crystal material 2, which have been bonded to each other, in a heated environment with a temperature of 500° C. to divide the separation layer 3. In this case, the microcavities in the separation layer 3 are grown by thermal stress. A portion of the first piezoelectric single crystal material 1 located below the separation layer 3, the portion having a thickness of about 1 µm, is detached as a piezoelectric single-crystal thin film 4. The piezoelectric single-crystal thin film 4 defines a piezoelectric composite substrate 5 together with the support substrate 2. The thickness of the piezoelectric single-crystal thin film 4 is determined by the energy of ion implantation. The thickness is independent of the undulation of the substrate and thus is stable. The sound velocity of a surface acoustic wave is determined by the thickness. The production method according to this preferred embodiment, therefore, provides a surface acoustic wave resonator having stable performance.

In this step, heat affects the bonding surface between the piezoelectric single-crystal thin film 4 and the second piezoelectric single crystal material 2 of the piezoelectric composite substrate 5. As described above, because the bonding surface has weak pyroelectricity, some pyroelectric charges are generated. However, the total amount of the pyroelectric charges is small. Thus, the bonding surface between the first piezoelectric single crystal material 1 and the second piezoelectric single crystal material 2 assuredly has sufficient quality.

Next, a polishing step (S4) of subjecting the separated surface of the remaining first piezoelectric single crystal material 1 and the separated surface of the piezoelectric composite substrate 5 to chemical-mechanical polishing (CMP) is performed. Here, each of the separated surface of the first piezoelectric single crystal material 1 and the separated surface of the piezoelectric composite substrate 5 has a roughness of about 10 nm in terms of a root-mean-square value (RMS), which is rough. Thus, mirror polishing is performed by CMP in such a manner that the roughness preferably is about 1 nm or less, for example. In CMP, a portion located within about 100 nm from each of the main surfaces in the depth direction is removed. The mirror-polished piezoelectric single crystal material 1 is used again in the ion-implantation step.

The first piezoelectric single crystal material 1 after mirror polishing is reused. Thus, several tens to several hundreds of piezoelectric single-crystal thin films 4 can be provided from the expensive first piezoelectric single crystal material 1, thereby reducing the amounts of, for example, Li and Ta used per piezoelectric single-crystal thin film 4 and thus reducing the environmental impact. Furthermore, the use of the inexpensive second piezoelectric single crystal material 2 provides the piezoelectric composite substrate 5 at low cost. The reasons the piezoelectric single crystal material 1 is expensive are that the growing speed of the single crystal is slow, it is difficult to slice the single crystal because it easily breaks, and the materials, such as Li and Ta, are rare materials.

Next, a repolarizing step (S5) of subjecting the mirror-polished piezoelectric composite substrate 5 to repolarizing is performed. Here, pulses with a pulse width of about 5 ms and a pulse voltage of about 22 kV, for example, are preferably applied to the piezoelectric composite substrate 5 in an environment with a temperature of about 400° C. from the direction normal to the main surface of the piezoelectric composite substrate 5. In this preferred embodiment, the surface on the piezoelectric single-crystal thin film 4 side has a positive polarity. The surface on the second piezoelectric single crystal material 2 side has a negative polarity. This determines the direction of polarization. That is, a negative potential is applied to the piezoelectric single-crystal thin film 4 side. A positive potential is applied to the second piezoelectric single crystal material 2 side. Accordingly, an electric field is unidirectionally applied to the inside of the piezoelectric composite substrate 5. The positive ends of the electric dipoles point toward the negative potential. The negative ends of the electric dipoles point toward the positive potential. As a result, the partially reversed polarization is recovered. This step is preferably performed after the separation step. The repolarizing step is performed at about 200° C. to about 1200° C. in view of the melting points of these components and the difference in thermal coefficient of expansion. A higher temperature results in a reduction in coercive electric field, thereby reducing the applied electric field. When the electric field is intermittently applied for a duration of about 1 μs to about 1 minute, for example, damage to the crystal due to a direct electric field can be prevented, which is preferable. Furthermore, heating at about 200° C. or higher, for example, is preferable because the strain in the crystal due to ion implantation is relaxed. A heating temperature for reducing the strain in the crystal is preferably set to at least about 100° C. lower than the Curie temperature, for example, in order to avoid the disappearance of polarization.

In this step, the layers of the piezoelectric composite substrate 5 placed in an electric field are deformed by the piezoelectric effect. The difference in strain between the piezoelectric single-crystal thin film 4 and the second piezoelectric single crystal material 2 at the bonding surface causes the risk of wafer breakage. In this production method, the direction of the polarization of each of the piezoelectric single-crystal thin film 4 and the second piezoelectric single crystal material 2 is set in such a manner that the upper portion has a positive polarity and that the lower portion has a negative polarity in the direction normal to the main surface, thereby resulting in the same strain direction in the direction normal to the main surface. This reduces the amount of relative displacement of each of the piezoelectric single crystal materials and the risk of wafer breakage, thereby improving the quality of the bonding surface between the piezoelectric single crystal material 1 and the piezoelectric single crystal material 2. With respect to the piezoelectric single crystal material 2, any inclination of the polar axis to the direction normal to the main surface may be used. When the inclination of the polar axis of the piezoelectric single crystal material 2 is equalized to the inclination of the polar axis of the piezoelectric single crystal material 1, wafer breakage can be further inhibited, which is preferred.

When the polarization of a piezoelectric material is reversed in the direction of an applied electric field, an inversion current is generated. In this production method, the direction of the polarization of the piezoelectric single-crystal thin film 4 is equalized to that of the piezoelectric single crystal material 2 in the direction normal to the main surface. Thus, substantially no reversed polarization occurs in the piezoelectric single crystal material 2. So, a weak inversion current in the piezoelectric single-crystal thin film is easily detected. Therefore, the use of the inversion current enables us to control the repolarizing step and determine the completion of the repolarizing step.

Next, IDT electrodes 6 preferably made of Al, for example, are formed on the piezoelectric single-crystal thin film 4 of the piezoelectric composite substrate 5 by photolithography to define a surface acoustic wave resonator (S6).

The piezoelectric composite substrate 5 according to the first preferred embodiment of the present invention may be produced through the foregoing production steps.

In this preferred embodiment, the method for producing a surface acoustic wave resonator has been described above. Furthermore, according to various preferred embodiments of the present invention, methods for producing a bulk acoustic wave resonator and a boundary acoustic wave resonator can also be provided. The bulk acoustic wave resonator and the surface acoustic wave resonator may have typical structures. The boundary acoustic wave resonator may have a structure disclosed in, for example, Japanese Patent Application No. 2003-32409.

Second Preferred Embodiment

A method for producing a piezoelectric composite substrate according to a second preferred embodiment of the present invention will be described below with reference to a method for producing a surface acoustic wave resonator as an example.

Figure 3:
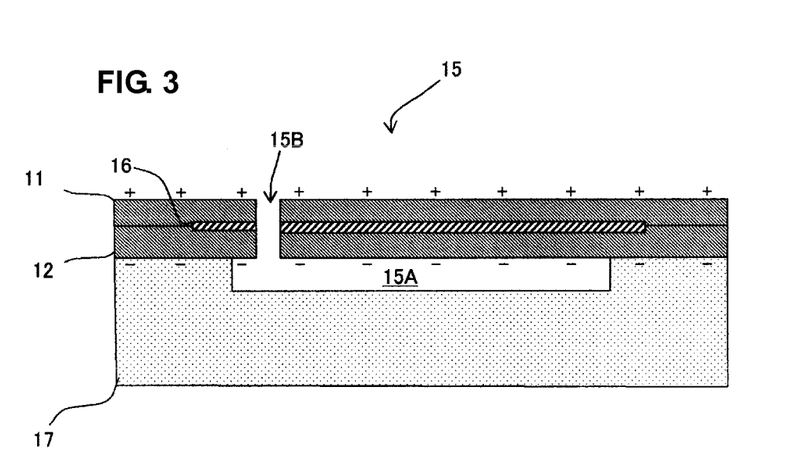
FIG. 3 illustrates an example of the structure of a surface acoustic wave resonator according to a second preferred embodiment of the present invention.

FIG. 3 illustrates an example of the structure of a piezoelectric composite substrate 15 produced in this preferred embodiment.

The piezoelectric composite substrate 15 includes piezoelectric single crystal materials 11 and 12, a Si base 17, and an intermediate layer electrode pattern 16. Each of the piezoelectric single crystal materials 11 and 12 preferably has a thickness of about 0.1 μm to about 9.9 μm, for example. The Si base 17 preferably has a thickness of about 0.5 mm and is connected to the piezoelectric single crystal material 12. A vibration space 15A is exposed at a bonding surface between the Si base 17 and the piezoelectric single crystal material 12, the vibration space 15A being formed by removing a sacrificial layer. Furthermore, a hole 15B passing through the piezoelectric single crystal materials 11 and 12 is provided. The intermediate layer electrode pattern 16 is partially arranged between the piezoelectric single crystal materials 11 and 12. With respect to the piezoelectric single crystal materials 11 and 12, regions including end portions of the main surfaces are directly bonded to each other, and regions including the central portions of the main surfaces are bonded to each other with the intermediate layer electrode pattern 16 provided therebetween.

In this preferred embodiment, the piezoelectric single crystal material 11 is a first piezoelectric single crystal material and has the same structure as that of the piezoelectric single crystal material 1 in the first preferred embodiment. That is, the piezoelectric single crystal material 11 preferably is a 42° Y cut $LiTaO_3$ substrate, for example. Each of the main surfaces of the piezoelectric single crystal material 11 is positively or negatively polarized.

Similarly, the piezoelectric single crystal material 12 is a second piezoelectric single crystal material and has the same structure as that of the piezoelectric single crystal material 11. That is, the piezoelectric single crystal material 12 preferably is a 42° Y cut $LiTaO_3$ substrate, for example. Each of the main surfaces thereof is positively or negatively polarized.

Figure 4:
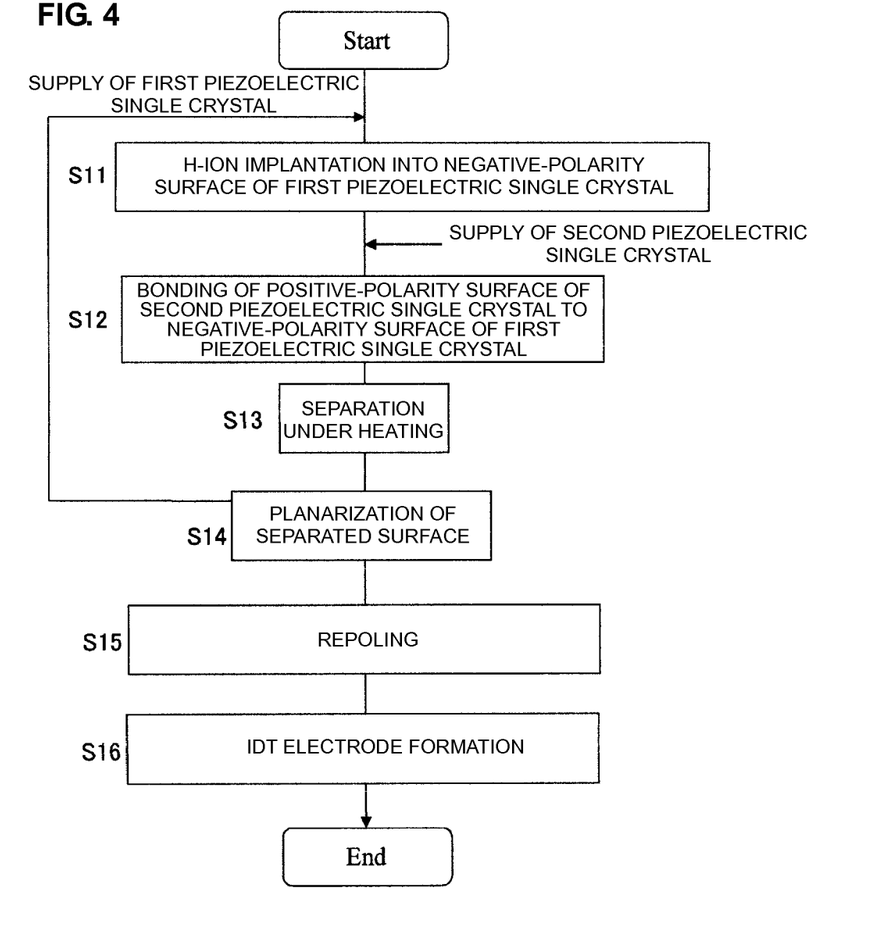
FIG. 4 illustrates a flow chart of a method for producing a surface acoustic wave resonator according to the second preferred embodiment of the present invention.
Figure 5:
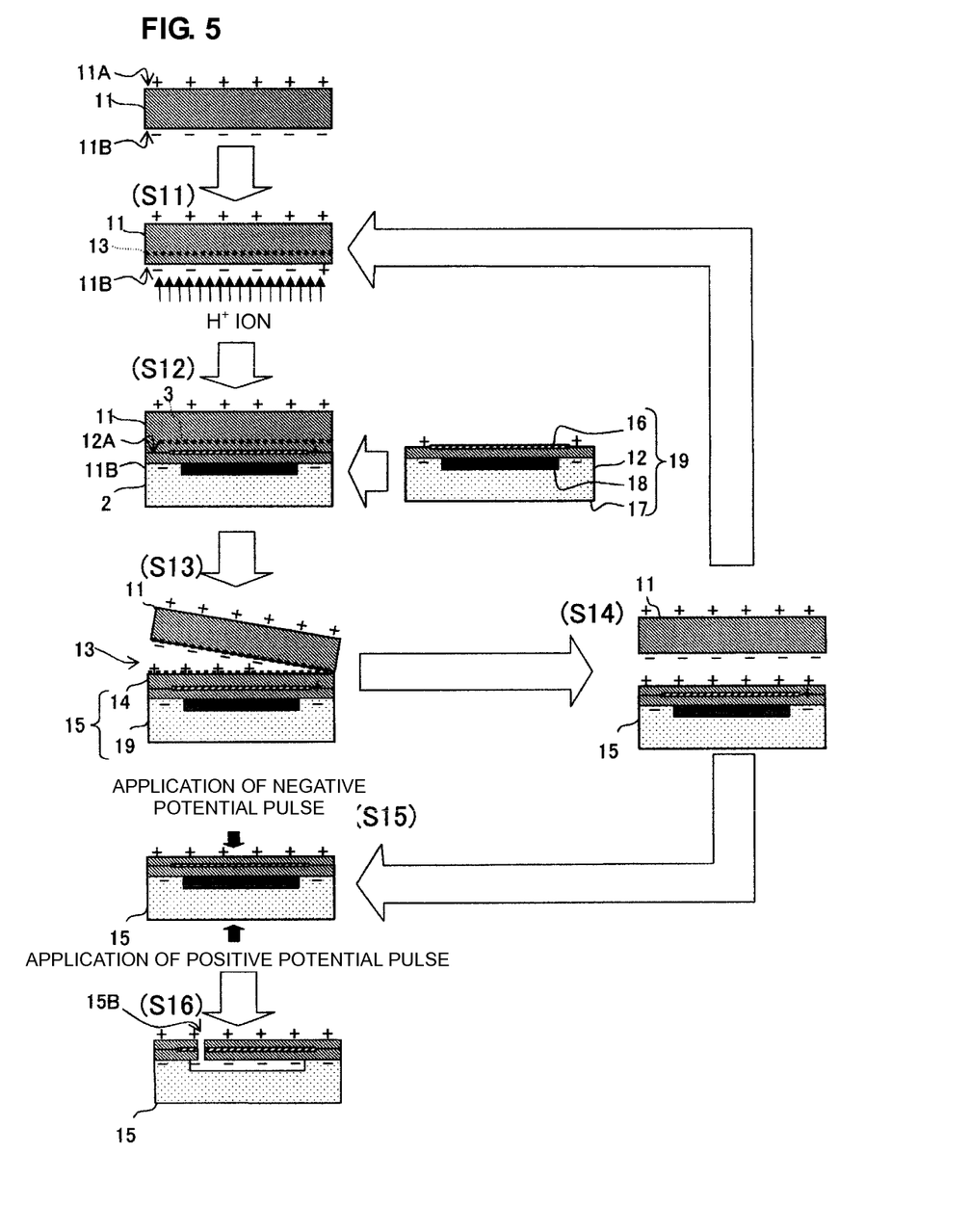
FIG. 5 is a schematic view illustrating a piezoelectric composite substrate, a piezoelectric single crystal material, and a support substrate in steps in the flow chart according to the second preferred embodiment of the present invention.

FIG. 4 illustrates a flow chart of a method for producing a surface acoustic wave resonator according to this preferred embodiment. FIG. 5 is a schematic view illustrating a piezoelectric composite substrate and a piezoelectric single crystal material in steps in the flow chart according to this preferred embodiment.

In this production process, an ion-implantation step (S11) of implanting $H^+$ ions into a main surface 11B of the piezoelectric single crystal material 11 is performed. The main surface 11B has been mirror-polished. Here, the main surface 11B is a first polar surface having a substantially uniform, negative polarity. A main surface 11A opposite the main surface 11B is a polar surface having a substantially uniform, positive polarity.

The implantation energy of $H^+$ ions is preferably set to about 150 KeV, for example. The dose level (density of implanted ions) is preferably set to about $9 \times 10^{16}$ atom/cm$^2$, for example. In this case, $H^+$ ions are accumulated at a depth of about 1 μm below the main surface 11B of the first piezoelectric single crystal material 11 to form microcavities, which is defined as a separation layer 13. Here, the polarization of the main surface 11B can be partially reversed by the energy of ions implanted, so that the main surface 11B can partially have a positive polarity.

A bonding step (S12) of directly bonding the main surface 11B of the first piezoelectric single crystal material to a main surface of the piezoelectric single crystal material 12 is performed. The piezoelectric single crystal material 12 used in this step is formed in a composite substrate 19 in advance. The composite substrate 19 includes the Si base 17 provided with a sacrificial layer 18, the Si base 17 being bonded to a negatively polarized surface of the piezoelectric single crystal material 12, and the intermediate layer electrode pattern 16 arranged on a positively polarized surface of the piezoelectric single crystal material 12. The main surface 11B, which is a negatively polarized surface, of the piezoelectric single crystal material 11 is bonded to the positively polarized surface of the piezoelectric single crystal material 12 of the composite substrate 19 and a surface where the intermediate layer electrode pattern 16 is exposed.

The composite substrate 19 is produced as follows. A recess to be formed into the vibration space 15A on a main surface of the Si base 17 is formed by reactive ion etching. The sacrificial layer 18 is formed in the recess. Then the main surface of the Si base 17 is planarized by CMP. An ion-implanted piezoelectric single crystal material is bonded to the surface of the Si base 17 where the sacrificial layer is arranged. A thin film to be formed into the piezoelectric single crystal material 12 is separated by heating. After surface polishing by CMP, the intermediate layer electrode pattern 16 is formed. The composite substrate 19 may be prepared through the steps described above.

Here, because the region including the end portion of the negatively polarized surface of the piezoelectric single crystal material 11 is directly bonded to the region including the end portion of the positively polarized surface of the piezoelectric single crystal material 12, the polarities of the polarized surfaces are basically canceled. However, the polarities given by partial polarization reversal due to ion implantation and thermal bonding remain without being canceled. So, the bonding surface has weak piezoelectricity. At a position where the intermediate layer electrode pattern 16 is arranged between the piezoelectric single crystal material 11 and the piezoelectric single crystal material 12, pyroelectricity is not caused.

A separation step (S13) is performed which includes disposing the piezoelectric single crystal material 11 and the composite substrate 19, which have been bonded to each other, in a heated environment with a temperature of about 500° C., for example, to divide the separation layer 13. In this case, the microcavities in the separation layer 13 are grown by thermal stress. A portion of the piezoelectric single crystal material 11 located below the separation layer 13, the portion having a thickness of about 1 μm, is detached as a piezoelectric single-crystal thin film 14. The piezoelectric single-crystal thin film defines the piezoelectric composite substrate 15 together with the composite substrate 19. The thickness of the piezoelectric single-crystal thin film 14 is determined by the energy of ion implantation. The thickness is independent of the undulation of the substrate and thus is stable. The sound velocity of a surface acoustic wave is determined by the thickness. The production method according to this preferred embodiment, therefore, provides a surface acoustic wave resonator having stable performance.

In this step, heat affects the piezoelectric single-crystal thin film 14 and the composite substrate 19 of the piezoelectric composite substrate 15 and the bonding surface. As described above, with respect to the bonding surface, because the regions including the end portions of the main surfaces have weak pyroelectricity, some pyroelectric charges are generated. However, the total amount of the pyroelectric charges is small. Thus, the bonding surface assuredly has sufficient quality.

Next, a polishing step (S14) of subjecting the separated surface of the remaining piezoelectric single crystal material 11 and the separated surface of the piezoelectric composite substrate 15 to chemical-mechanical polishing (CMP) is performed. The mirror-polished piezoelectric single crystal material 11 is used again in the ion-implantation step.

Next, a repolarizing step (S15) of subjecting the mirror-polished piezoelectric composite substrate 15 to repolarizing is performed. Here, pulses with a pulse width of about 5 ms and a pulse voltage of about 22 kV, for example, are applied to the piezoelectric composite substrate 15 in an environment with a temperature of about 400° C., for example, from the direction normal to the main surface of the piezoelectric composite substrate 15. In this preferred embodiment, a negative potential is applied to the piezoelectric single-crystal thin film 14 side. Accordingly, an electric field is unidirectionally applied to the inside of the piezoelectric composite substrate 15. As a result, the partially reversed polarization is recovered.

In this step, the piezoelectric layers of the piezoelectric composite substrate 15 placed in an electric field are deformed by the piezoelectric effect. The difference in strain between the piezoelectric layers at the bonding surfaces causes the risk of wafer breakage. In this production method, the direction of the polarization of each of the piezoelectric single-crystal thin film 14 and the piezoelectric single crystal material 12 is set in such a manner that the upper portion has a positive polarity and that the lower portion has a negative polarity in the direction normal to the main surface, thereby resulting in the same strain direction in the direction normal to the main surface. This reduces the amount of relative displacement of each of the piezoelectric single crystal materials and the risk of wafer breakage. Furthermore, the inclination of the polar axis of the piezoelectric single crystal material 12 to the direction normal to the main surface is equalized to the inclination of the polar axis of the piezoelectric single crystal material 11, thereby resulting in the same strain direction in the direction parallel to the main surface. An adverse effect due to the strain in the repolarizing step occurs regardless of the presence or absence of the intermediate layer electrode pattern. Even if a plurality of piezoelectric single crystal materials are not directly bonded, the effect of reducing the strain is provided.

In this production method, the direction of the polarization of the piezoelectric single-crystal thin film 14 is equalized to that of the piezoelectric single crystal material in the direction normal to the main surface. Thus, substantially no reversed polarization occurs in the piezoelectric single crystal material 12. So, a weak inversion current in the piezoelectric single crystal thin film 14 is easily detected.

Next, the hole 15B communicating to the sacrificial layer is formed in the piezoelectric single crystal thin film 14 and the piezoelectric single crystal material 12 of the piezoelectric composite substrate 15 by, for example, etching. Removal of the sacrificial layer 18 results in the vibration space 15A (S16).

The piezoelectric composite substrate 15 according to the second preferred embodiment of the present invention may be produced by the production method described above.

In this preferred embodiment, the method for producing a surface acoustic wave resonator has been described above. Furthermore, according to the present invention, methods for producing a bulk acoustic wave resonator and a boundary acoustic wave resonator can also be provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for producing a piezoelectric composite substrate including a first piezoelectric single crystal material, in which a piezoelectric effect is used, and a second piezoelectric single crystal material bonded to the first piezoelectric single crystal material, the method comprising:

an ion-implantation step of implanting ions into a first polar surface of the first piezoelectric single crystal material, the first polar surface having a substantially uniform polarity, to form localized microcavities in a separation layer located inside the first piezoelectric single crystal material and spaced apart from the first polar surface;

after the ion-implantation step, a bonding step of bonding the first polar surface of the first piezoelectric single crystal material to a second polar surface of the second piezoelectric single crystal material, the second polar surface having a substantially uniform polarity opposite to that of the first polar surface; and after the bonding step, a separation step of subjecting the microcavities to thermal stress to divide the separation layer from a portion of the first piezoelectric single crystal material.

2. The method for producing a piezoelectric composite substrate according to claim 1, further comprising after the bonding step, a repolarizing step of applying an electric field to the first piezoelectric single crystal material to recover partially reversed polarization of the first polar surface.

3. The method for producing a piezoelectric composite substrate according to claim 2, wherein the repolarizing step is performed after the separation step.

4. The method for producing a piezoelectric composite substrate according to claim 1, wherein in the bonding step, the second piezoelectric single crystal material is bonded to the first piezoelectric single crystal material in such a manner that a direction of the polar axis of the second piezoelectric single crystal material is the same as that of the first piezoelectric single crystal material.

5. The method for producing a piezoelectric composite substrate according to claim 1, wherein in the ion-implantation step, ions having an opposite polarity to that of the first polar surface are implanted into the first polar surface.

6. The method for producing a piezoelectric composite substrate according to claim 1, wherein an electrode pattern is arranged on the first polar surface or the second polar surface in such a manner that the first polar surface or the second polar surface is partially exposed.

7. A method for producing a piezoelectric element, comprising a step of:

forming a driving electrode on the first piezoelectric single crystal material of the piezoelectric composite substrate produced by the method according to claim 1.

* * * * *